United States Patent
Ranacher et al.

(10) Patent No.: US 11,286,158 B2
(45) Date of Patent: Mar. 29, 2022

(54) MEMS-COMPONENT

(71) Applicant: Infineon Technologies AG, Neubiberg (DE)

(72) Inventors: Christian Ranacher, Gaimberg (AT); Banafsheh Abasahl, Villach (AT); Cristina Consani, Villach (AT); Thomas Grille, Villach (AT); Peter Irsigler, Obernberg/Inn (AT); Andreas Tortschanoff, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 97 days.

(21) Appl. No.: 16/287,232

(22) Filed: Feb. 27, 2019

(65) Prior Publication Data
US 2019/0270640 A1 Sep. 5, 2019

(30) Foreign Application Priority Data
Mar. 1, 2018 (DE) .................... 102018203100.2

(51) Int. Cl.
*B81B 7/02* (2006.01)
*B81B 3/00* (2006.01)
(Continued)

(52) U.S. Cl.
CPC .............. *B81B 7/02* (2013.01); *B81B 3/0032* (2013.01); *G01J 3/021* (2013.01); *G01J 3/0202* (2013.01);
(Continued)

(58) Field of Classification Search
CPC .... B81B 2201/0214; B81B 2203/0127; B81B 2203/0315; B81B 2203/04; B81B 3/0032;
(Continued)

(56) References Cited

U.S. PATENT DOCUMENTS

| 2005/0111008 A1 | 5/2005 | Murata |
| 2008/0093608 A1* | 4/2008 | Chik ...................... H05B 33/08 257/89 |

(Continued)

FOREIGN PATENT DOCUMENTS

| DE | 102014114672 A1 | 4/2015 |
| DE | 102016205024 A1 | 9/2016 |
| DE | 102017102188 A1 | 10/2017 |

OTHER PUBLICATIONS

Schjolberg-Henriksen, K., et al., "High-resolution pressure sensor for photo acoustic gas detection," ScienceDirect, Sensors and Actuators, 132, www.sciencedirect.com, Feb. 2006, pp. 207-213.

*Primary Examiner* — Mark W Tornow
*Assistant Examiner* — Priya M Rampersaud
(74) *Attorney, Agent, or Firm* — Slater Matsil, LLP (57) ABSTRACT

A MEMS component includes a semiconductor substrate stack having a first semiconductor substrate and a second semiconductor substrate, wherein the semiconductor substrate stack has a cavity formed within the first and second semiconductor substrates, and wherein at least the first or the second semiconductor substrate has an access opening for gas exchange between the cavity and an environment. A radiation source is arranged at the first semiconductor substrate, and a radiation detector is arranged at the second semiconductor substrate. Two mutually spaced apart reflection elements are arranged in a beam path between the radiation source and the radiation detector, wherein one reflection element is partly transmissive to the emitted radiation from the cavity in the direction of the radiation detector, and wherein an interspace between the two mutually spaced apart reflection elements has a length that is at least ten times the wavelength of the emitted radiation.

23 Claims, 8 Drawing Sheets

(51) Int. Cl.

| | | |
|---|---|---|
| *G02B 26/00* | (2006.01) | |
| *G01J 3/02* | (2006.01) | |
| *G01N 21/3504* | (2014.01) | |
| *G01J 3/42* | (2006.01) | |
| *G01N 21/03* | (2006.01) | |
| *G01J 3/26* | (2006.01) | |

(52) U.S. Cl.
CPC ............... *G01J 3/0291* (2013.01); *G01J 3/26* (2013.01); *G01J 3/42* (2013.01); *G01N 21/031* (2013.01); *G01N 21/3504* (2013.01); *G02B 26/001* (2013.01); *B81B 2201/0214* (2013.01); *B81B 2203/0127* (2013.01); *B81B 2203/0315* (2013.01); *B81B 2203/04* (2013.01)

(58) Field of Classification Search
CPC . B81B 7/02; G01J 3/0202; G01J 3/021; G01J 3/0291; G01J 3/26; G01J 3/42; G01N 21/031; G01N 21/3504; G02B 26/001; G02B 26/0833
See application file for complete search history.

(56) References Cited

U.S. PATENT DOCUMENTS

| | | | |
|---|---|---|---|
| 2014/0368826 A1* | 12/2014 | Abbott, Jr | H01L 31/173 |
| | | | 356/454 |
| 2015/0101395 A1 | 4/2015 | Dehe et al. | |
| 2017/0343419 A1* | 11/2017 | Hopper | G01J 3/42 |
| 2017/0350813 A1* | 12/2017 | Lin | G01J 3/0237 |
| 2019/0120751 A1* | 4/2019 | Lin | G01N 21/255 |

\* cited by examiner

MEMS-COMPONENT

This application claims the benefit of German Application No. 102018203100.2, filed on Mar. 1, 2018, which application is hereby incorporated herein by reference.

TECHNICAL FIELD

The invention relates to a MEMS component (MEMS: microelectromechanical system), and in particular to a gas sensor having an integrated vertical cavity, said gas sensor being embodied as a MEMS component.

BACKGROUND

Monitoring of the air quality in our environment is receiving more and more attention. Commercially available sensors are either large-format or slow. If sensors of this type are intended to be used in consumer electronics, the sensor should be small and expedient. In order to solve this problem, numerous research studies are under way to develop a CMOS-compatible miniaturized infrared absorption gas sensor. A sensor of this type could be used in vehicle or consumer electronics devices for the purpose of gas detection. Specific challenges here are the light throughput and the relatively long interaction lengths required for gas detection. Moreover, the technological processes are sometimes very complex and difficult to be implemented in the context of CMOS technology (e.g. quantum cascade lasers).

Known sensors for gas detection are based for example on the concept of resonator-amplified IR absorption spectroscopy or cavity ring-down spectroscopy (CRDS), in which resonators are used to increase the interaction time of light with matter. However, these techniques typically use very refined resonators having high Q-factors based on mirrors having high reflectivity (R>99.99%). Such realizations in this context are currently composed of large, discrete optical components.

A further known approach for increasing the interaction length during IR absorption spectroscopy of gases is the use of multi pass cells (e.g. White cell, Herriott cell). Multi pass cells provide an intuitive and appealing solution for increasing the interaction length; however, the implementation thereof proves to be technically complex if a large number of passes are desired. The demanding optical alignment thereof requires highly stable and curved optomechanical systems and a large sample volume in order to reduce the disadvantageous effects of optical interference between adjacent reflections. The need for exactly curved and inclined elements is currently a major obstacle to the realization of miniaturized multi pass cells.

Furthermore, MEMS Fabry-Pérot resonators having different geometric structures are known, inter alia for use as spectroscopy systems. In some examples, tunable detectors are known which use one or more tunable Fabry-Pérot filters. Other examples use integrated tunable sources which use one or more diodes and a tunable Fabry-Pérot filter or a Fabry-Pérot Etalon. The advantages associated with the use of the tunable etalon are that the latter can be a small component having a relatively low power consumption. By way of example, recent MEMS implementations of these components may be of the size of a chip. This increases their robustness and moreover their performance. Furthermore, an isolator, an amplifier and/or a reference system are/is integrated in some examples. However, the typical feature of a Fabry-Pérot resonator is the wavelength selectivity thereof, which does not apply to the MEMS component described herein.

Furthermore, MOX sensors (MOX: metal oxide) are known. Commercially available CMOS gas sensors are MOX sensors whose conductivity changes if they adsorb gases on their surface. In comparison with optical sensors, said CMOS gas sensors are based on a totally different detection principle with different advantages and disadvantages.

A further approach consists in developing an evanescent field absorption sensor, which uses a subwavelength waveguide as an interaction path. Radiation in the mid-infrared range having a wavelength tuned to the absorption band of the gas to be detected is guided by a dielectric waveguide. On account of the subwavelength dimensions of the waveguide, a small section of the field, the so-called evanescent field, extends outside the waveguide and can interact with its environment. However, the internal losses on account of the waveguide material and the small evanescent field ratio are disadvantageous, as a result of which this approach is better suited to the detection of liquids.

To summarize, accordingly, multi-reflection gas measuring cells and Fabry-Pérot sensors are known, inter alia. Multi-reflection cells are typically designed for a high number of reflections (trace gas analysis). Fabry-Pérot sensors exhibit a different core functionality. Both approaches require highly or very highly reflective mirrors. Evanescent field absorption sensors can indeed be produced with small dimensions or form factors, but they have high losses.

SUMMARY

Accordingly, it would be desirable to provide a MEMS component which is usable for optical gas detection, for example, wherein the MEMS component, while avoiding the disadvantages mentioned above, has inter alia a small form factor in conjunction with high performance.

A MEMS component having the features of claim 1 is therefore proposed. Embodiments and further advantageous aspects of this MEMS component are mentioned in the respectively dependent patent claims.

Such a MEMS component comprises a semiconductor substrate stack, inter alia. The semiconductor substrate stack has a first semiconductor substrate and a second semiconductor substrate connected thereto. Moreover, the semiconductor substrate stack has a cavity formed within the first and second semiconductor substrates. In this case, at least the first or the second semiconductor substrate has an access opening for gas exchange between the cavity and an environment. A radiation source is arranged at the first semiconductor substrate, said radiation source being configured to emit radiation into the cavity, and a radiation detector is arranged at the second semiconductor substrate, said radiation detector being configured to receive at least one part of the radiation emitted by the radiation source through the cavity. Two mutually spaced apart reflection elements for reflecting the emitted radiation are arranged in a beam path between the radiation source and the radiation detector, wherein at least one reflection element is partly transmissive to the emitted radiation from the cavity in the direction of the radiation detector. An interspace between the two mutually spaced apart reflection elements has a length that is at least ten times the wavelength of the emitted radiation.

BRIEF DESCRIPTION OF THE DRAWINGS

Some exemplary embodiments are illustrated by way of example in the drawing and are explained below. In the figures.

DETAILED DESCRIPTION OF ILLUSTRATIVE EMBODIMENTS

Exemplary embodiments are described in greater detail below with reference to the figures, wherein elements having the same or a similar function are provided with the same reference signs.

Moreover, an optical radiation is described herein in an exemplary way on the basis of the example of infrared light, for example in the mid-infrared range. However, optical radiation in other wavelength ranges can also be used with the MEMS component.

Figure 1:
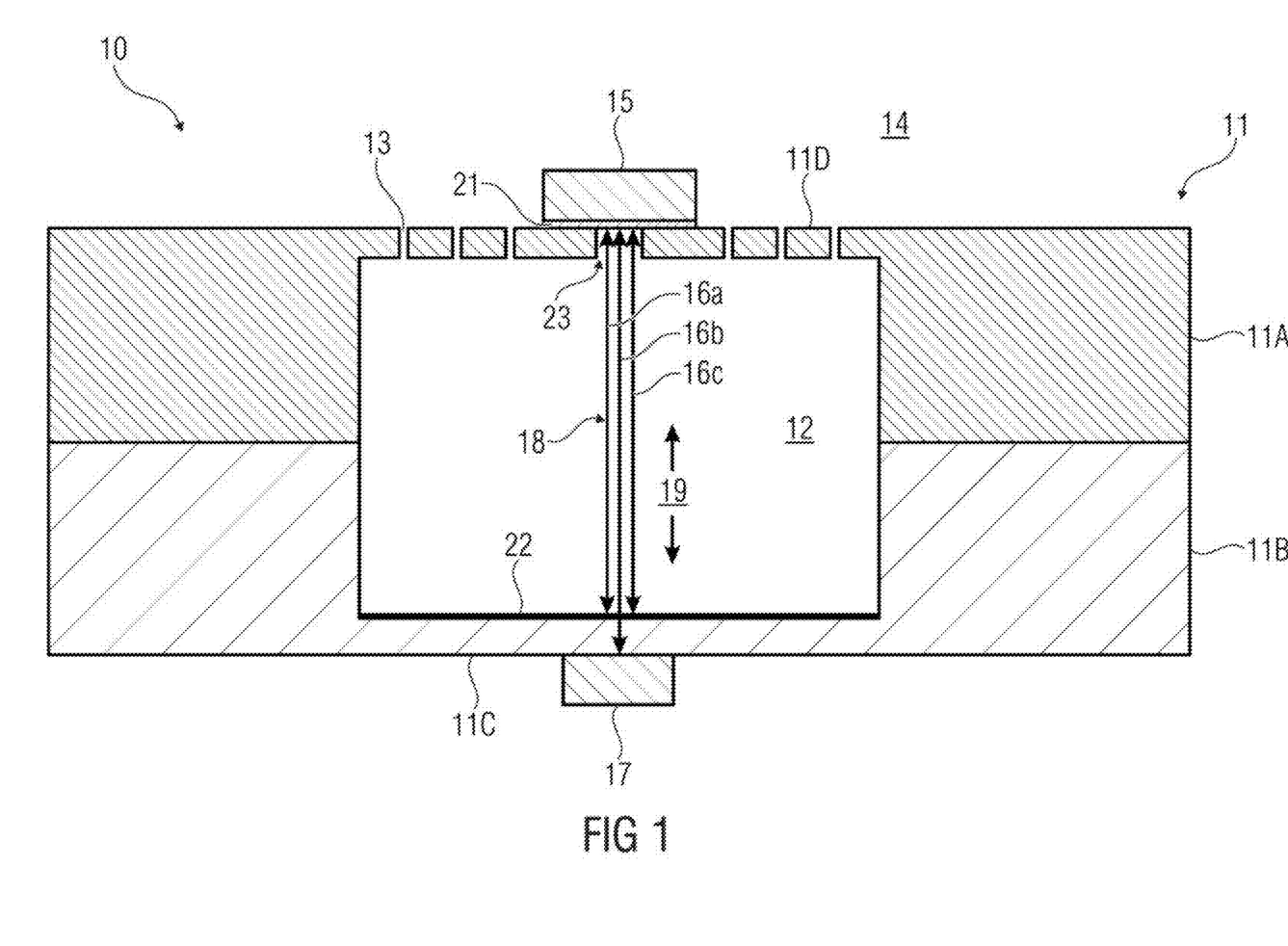
FIG. 1 shows a lateral sectional view of a MEMS component in accordance with one exemplary embodiment.

FIG. 1 shows a lateral sectional illustration of one exemplary embodiment of a MEMS component 10.

The MEMS component 10 comprises a semiconductor substrate stack 11. The semiconductor substrate stack 11 has a first semiconductor substrate 11A and a second semiconductor substrate 11B connected, for example bonded, thereto.

Moreover, the semiconductor substrate stack 11 has a cavity 12 formed within the first and second semiconductor substrates 11A, 11B.

At least the first or the second semiconductor substrate 11A, 11B can have at least one access opening 13 for gas exchange between the cavity 12 and an environment 14.

A radiation source 15 can be arranged at the first semiconductor substrate 11A. The radiation source 15 can be configured to emit radiation into the cavity 12. Said radiation is symbolized by arrows 16a, 16b, 16c in FIG. 1.

A radiation detector 17 can be arranged at the second semiconductor substrate 11B. The radiation detector 17 is configured to receive at least one part of the radiation 16a, 16b, 16c emitted by the radiation source 15 through the cavity 12. In FIG. 1, by way of example, the arrow 16b is depicted as the received part of the radiation.

Alternatively, it would be conceivable for the radiation detector 17 to be arranged at the first semiconductor substrate 11A, and the radiation source 15 at the second semiconductor substrate 11B.

The radiation 16a, 16b, 16c can be an optical radiation. In one exemplary embodiment, the radiation source 15 can be configured to emit infrared radiation in a wavelength range of 0.8 µm to 40 µm, or of 1 µm to 20 µm, or of 1 µm to 10 µm, and the radiation detector 17 can be configured to receive infrared radiation in a wavelength range of 0.8 µm to 40 µm, or of 1 µm to 20 µm, or of 1 µm to 10 µm. Two mutually spaced apart reflection elements 21, 22 can be arranged in a beam path 18 between the radiation source 15 and the radiation detector 17. The two reflection elements 21, 22 are configured to reflect the emitted radiation 16a, 16b, 16c, wherein at least one reflection element 21, 22 is partly transmissive to the emitted radiation 16a, 16b, 16c from the cavity 12 in the direction of the radiation detector 17. In the exemplary embodiment depicted in FIG. 1, the second reflection element 22 is partly transmissive to the emitted radiation 16a, 16b, 16c. As can be discerned on the basis of the example of the arrow 16b, accordingly this part 16b of the radiation 16a, 16b, 16c, from the cavity 12 in the direction of the radiation detector 17, can pass through the second reflection element 22 and advance to the radiation detector 17.

In the exemplary embodiment depicted in FIG. 1, the second reflection element 22 is arranged within the cavity 12. The second reflection element 22 is arranged at a thinned-back region 11C of the second semiconductor substrate 11B, wherein said thinned-back region 11C has a smaller thickness than the rest of the second semiconductor substrate 11B. Instead of the thinned-back section, it could also be conceivable for the second semiconductor substrate 11B to be at least partly removed in the region of the cavity 12 and to have an additional layer 11C extending across the removed part of the second semiconductor substrate 11B. The second reflection element 22 can additionally be arranged opposite the radiation detector 17. Relative to the radiation emission direction (from the radiation source 15 to the radiation detector 17), the second reflection element 22 is arranged upstream of the radiation detector 17.

In the exemplary embodiment depicted in FIG. 1, the first reflection element 21 is arranged outside the cavity 12. The first reflection element 21 can be arranged at a thinned-back region 11D of the first semiconductor substrate 11A, wherein said thinned-back region 11D has a smaller thickness than the rest of the first semiconductor substrate 11A. Instead of the thinned-back section, it could also be conceivable for the first semiconductor substrate 11A to be at least partly removed in the region of the cavity 12 and to have an additional layer 11D extending across the removed part of the first semiconductor substrate 11A. The first reflection element 21 can additionally be arranged opposite the radiation source 15. Relative to the radiation emission direction (from the radiation source 15 to the radiation detector 17), the first reflection element 21 can be arranged downstream of the radiation source 15. In this exemplary embodiment, the first reflection element 21 is arranged between the radiation source 15 and the first semiconductor substrate 11.

As is shown in subsequent exemplary embodiments, it would also be conceivable for both the first reflection element 21 and the second reflection element 22 to be arranged within the cavity 12, or for both the first reflection element 21 and the second reflection element 22 to be arranged outside the cavity 12, or for the first reflection element 21 to be arranged within the cavity 12 and the second reflection element 22 to be arranged outside the cavity 12.

The first reflection element 21 can be embodied such that it is at least partly transmissive to the radiation 16a, 16b, 16c in the radiation emission direction, and partly transmissive or at least partly reflective in the opposite direction. The first reflection element 21 can additionally have the least possible absorption for the emitted radiation 16a, 16b, 16c.

The second reflection element 22 can be embodied such that it is at least partly transmissive and/or at least partly reflective to the radiation 16a, 16b, 16c in the radiation emission direction, such that a first part of the emitted radiation 16a, 16b, 16c is reflected at the second reflection element 22 and a second part of the emitted radiation 16a, 16b, 16c is able to be transmitted in the direction of the radiation detector 17.

Besides the at least one access opening 13 for gas exchange as mentioned above, the first semiconductor substrate 11A, in the region of the radiation source 15, can have a further opening 23, through which the emitted radiation 16a, 16b, 16c can pass and enter the cavity 12. The opening 23 is optional. As an alternative or in addition to the opening 23, the first semiconductor substrate 11A can comprise a material which is transmissive, or at least partly transmissive, to the emitted radiation 16a, 16b, 16c.

The MEMS component 10 additionally comprises an interspace 19 extending between the two mutually spaced apart reflection elements 21, 22. In the exemplary embodiment depicted in FIG. 1, the length of the interspace 19 would correspond approximately to the depicted arrows 16a and 16c, respectively. The concept of the MEMS component 10 as described herein provides for the interspace 19 to have a length that is at least ten times the wavelength of the emitted radiation 16a, 16b, 16c.

In further conceivable exemplary embodiments, the interspace 19 can have a length that is at least twenty times, or at least fifty times, the wavelength of the emitted radiation 16a, 16b, 16c.

In this design, the MEMS component 10 can be used for example as an optical gas sensor. In accordance with one conceivable exemplary embodiment, the MEMS component 10 can be embodied as a MEMS micro gas detector in order to detect at least one gas situated in the interspace 19 between the two reflection elements 21, 22, on the basis of absorption of the emitted radiation 16a, 16b, 16c by the radiation detector 17.

For this purpose, the radiation source 15 can emit optical radiation 16a, 16b, 16c. The wavelength range of the radiation 16a, 16b, 16c emitted by the radiation source 15 can be dependent on a medium to be examined that is situated in the interspace 19, which medium can also be referred to as an analyte.

By way of example, in the case of $CO_2$ as analyte, the radiation source 15 can emit radiation 16a, 16b, 16c in a wavelength range of 3 µm to 5 µm, and preferably of 4.2 µm to 4.3 µm.

Figure 8:
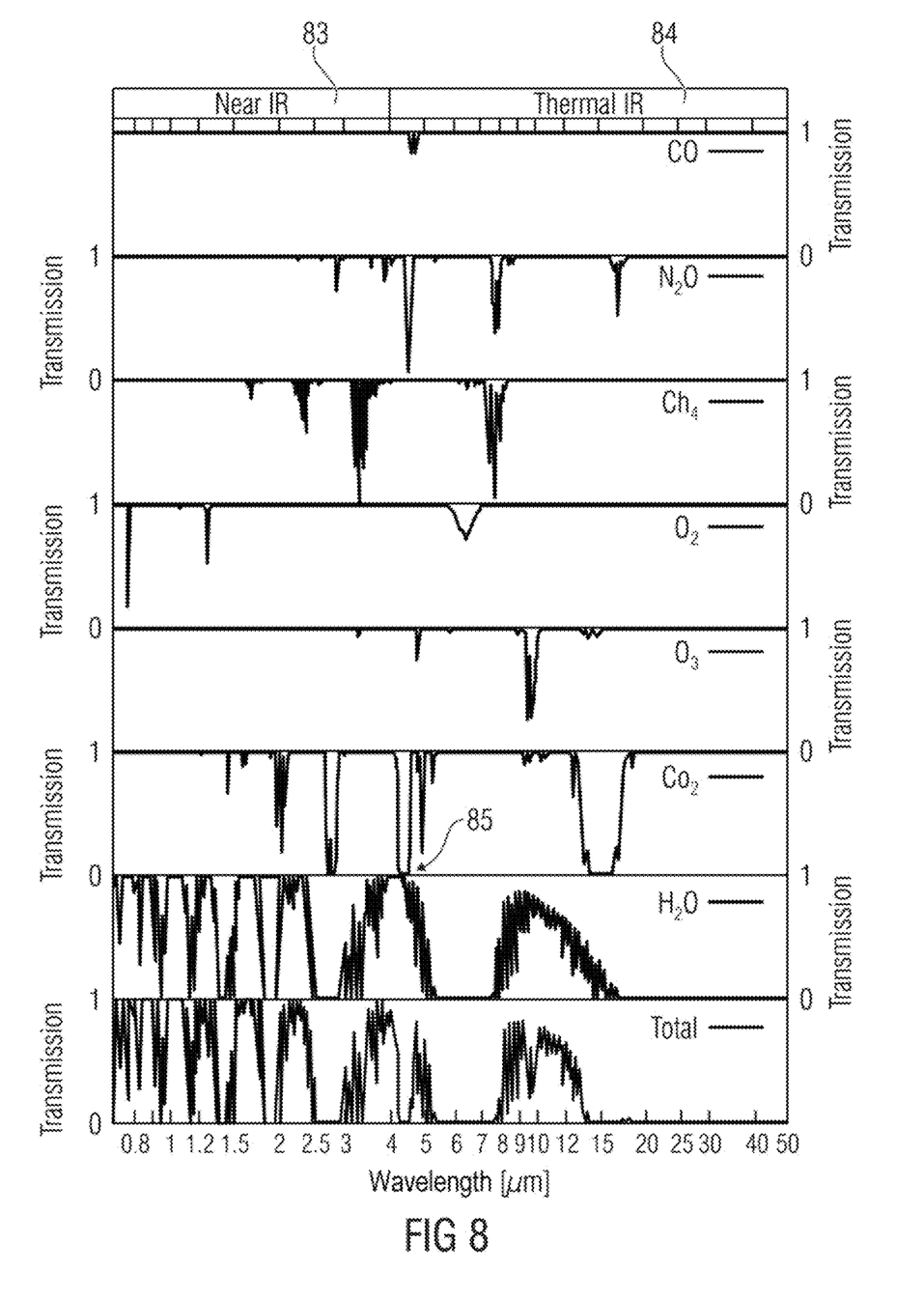
FIG. 8 shows a transmission spectrum for various analytes.

Further examples of selective wavelength ranges depending on the respective analyte are shown in FIG. 8. Eight different spectrograms are depicted therein in rows. The spectrograms depict the transmission of various analytes in the infrared range.

The first row shows a spectrogram for the transmission of CO. The second row shows a spectrogram for the transmission of $N_2O$. The third row shows a spectrogram for the transmission of $CH_4$. The fourth row shows a spectrogram for the transmission of $O_2$. The fifth row shows a spectrogram for the transmission of $O_3$. The sixth row shows a spectrogram for the transmission of $CO_2$. The seventh row shows a spectrogram for the transmission of $H_2O$. The eighth row shows a spectrogram for the transmission of all the above-mentioned components together.

The wavelength ranges are indicated on the x-axis. The spectrograms show the near infrared wavelength range 83 and the thermal infrared wavelength range 84.

The intensity of the transmission of the respective analyte from 0 to 1, i.e. from 0% transmission to 100% transmission, is represented on the y-axis. The difference with respect to the depicted transmission represents the value of the absorption of the respective analyte, i.e. 0% transmission corresponds to 100% absorption, and vice versa.

In this regard, for example in the spectrogram for $CO_2$ in the sixth row, a transmission minimum 85 is shown at approximately 4.2 µm to 4.3 µm. This transmission minimum 85 corresponds to an absorption maximum in the respective wavelength range.

Further advantageous wavelength ranges for specific analytes can be read off from these spectrograms.

By way of example, the MEMS component 10, likewise in the case of $CO_2$ as analyte, can be configured to use, i.e. to emit and/or to detect, radiation 16a, 16b, 16c in a wavelength range of 1.9 µm to 2.2 µm, or of 2.5 µm to 3.0 µm, or of 14.0 µm to 17.0 µm.

By way of example, the MEMS component 10, in the case of CO as analyte, can be configured to use, i.e. to emit and/or to detect, radiation 16a, 16b, 16c in a wavelength range of 4.1 µm to 5.0 µm.

By way of example, the MEMS component 10, in the case of $N_2O$ as analyte, can be configured to use, i.e. to emit and/or to detect, radiation 16a, 16b, 16c in a wavelength range of 4.4 µm to 4.8 µm.

By way of example, the MEMS component 10, in the case of $O_2$ as analyte, can be configured to use, i.e. to emit and/or to detect, radiation 16a, 16b, 16c in a wavelength range of 0.7 µm to 0.8 µm, or of 5.8 µm and 7.1 µm.

By way of example, the MEMS component 10, in the case of $O_3$ as analyte, can be configured to use, i.e. to emit and/or to detect, radiation 16a, 16b, 16c in a wavelength range of 9.0 µm to 10.2 µm.

The emitted radiation 16a, 16b, 16c enters the cavity 12 and propagates therein along a beam path 18 in the direction of the radiation detector 17 arranged opposite.

The two reflection elements 21, 22 are arranged between the radiation source 15 and the radiation detector 17. The radiation 16a, 16b, 16c passes firstly, in the emission direction, through the first reflection element 21. Afterward, at least a first portion of the radiation 16a, 16b, 16c can be reflected at the second reflection element 22 and be reflected back in the direction of the first reflection element 21. A second portion of the radiation 16a, 16b, 16c can pass through the second reflection element 22 to the radiation detector 17. However, in the course of the first pass a large part (i.e. >50%) of the radiation 16a, 16b, 16c can preferably be reflected at the second reflection element 22, as just described.

The radiation 16a, 16b, 16c can be reflected at least once at the first and/or the second reflection element 21, 22. However, the radiation 16a, 16b, 16c can also be reflected a number of times at the first and/or the second reflection element 21, 22. The number of reflections can be determined from the reflective power, or the reflectivity R, of the respective reflection element 21, 22.

By way of example, the first and/or the second reflection element 21, 22 can have a reflectivity R of 50%<R<98%, or of 60%<R<90%, or of 70%<R<85%.

On account of this/these reflection(s) of the radiation 16a, 16b, 16c, there is an increase in the effective path length—to be covered between the radiation source 15 and the radiation detector 17—of the emitted radiation 16a, 16b, 16c or of the beam path 18 within the cavity 12, or within the interspace 19. Consequently, there is available to the radiation 16a, 16b, 16c, in comparison with merely a single pass through the cavity 12 or interspace 19 without reflection, effectively a longer path for interacting with a medium contained in the cavity 12 or interspace 19. This effective path length of the radiation 16a, 16b, 16c for interaction with the medium is therefore also referred to as interaction length or interaction distance. The medium to be analyzed that is situated in the cavity 12 or interspace 19 is also referred to as an analyte. An analyte-dependent minimum required path length of the radiation 16a, 16b, 16c for interaction with the analyte is also referred to as a minimum interaction length.

The medium situated in the cavity 12 or interspace 19 can be, inter alia, $CO_2$, for example. A MEMS component 10 configured as an optical gas sensor could thus be configured to detect $CO_2$ optically by the emitted radiation 16a, 16b, 16c.

The interspace 19 between the two reflection elements 21, 22 thus forms a resonator or a multi pass cavity. The resonator 19 can serve to increase the effective interaction length. The emitted radiation 16a, 16b, 16c, for example infrared radiation, can accordingly thus be reflected a number of times in the resonator 19, as a result of which the interaction distance for the radiation 16a, 16b, 16c to interact with the analyte is increased and the sensitivity of the MEMS component 10 or sensor is increased as a result.

Since, according to the concept described here, the resonator 19 is much larger than the wavelength of the emitted radiation 16a, 16b, 16c, the effect on the spectral distribution is a very narrowly spaced frequency comb, which is not used to tune the wavelength selectively to the individual absorption band of the analyte. Therefore, here it is not used as a Fabry-Pérot resonator.

The length of the resonator 19 and the reflectivity of the reflection elements 21, 22 should be adapted to the absorption of the medium (e.g. gas) situated in the cavity 12, in order to obtain the optimum interaction length. Disregarding the damping on account of the gas or other loss processes, the light intensity I decreases in the resonator 19 since $I=I_0 \cdot R^n$, wherein R is the reflectivity. That is to say that the reflectivity should be $$R = \sqrt[n]{\frac{I}{I_0}} = \sqrt[n]{\frac{1}{e}}$$

in order to ensure "n" reflections before the intensity has fallen to 1/e.

In accordance with one exemplary embodiment, it can accordingly be conceivable that the length of the interspace 19 or of the cavity 12 corresponds to at least an average minimum interaction length dependent on the analyte. Accordingly, even a single pass of the emitted radiation 16a, 16b, 16c without reflection at the first and/or second reflection element 21, 22 could be sufficient to attain the minimum interaction length of the analyte and thus to determine the latter.

A further exemplary embodiment can provide for the two mutually spaced apart reflection elements 21, 22 to be configured to reflect the emitted radiation 16a, 16b, 16c in each case at least once in order to increase the interaction length of the emitted radiation 16a, 16b, 16c in the interspace 19 (resonator) between the two reflection elements 21, 22, wherein the interaction length increased by the reflection corresponds to at least an average minimum interaction length dependent on the analyte. That is to say that the reflection of the emitted radiation 16a, 16b, 16c at the reflection elements 21, 22 increases the distance to be covered by the radiation 16a, 16b, 16c between the radiation source 15 and the radiation detector 17 and thus the effective interaction length within which the radiation 16a, 16b, 16c can react with the analyte situated in the cavity 12 or in the interspace 19 (resonator). The interaction length, or a minimum interaction length, can thus be used synonymously with the length provided within the interspace 19 by reflection at the reflection elements 21, 22 for the radiation 16a, 16b, 16c on its path from the radiation source 15 to the radiation detector 17.

The minimum interaction length can be dependent on the analyte of the concentration to be measured, but also on the power of the radiation source 15 and of the detector 17. The minimum interaction length is the length that the radiation 16a, 16b, 16c has to cover as a minimum on average within the interspace 19 in order to be able to interact sufficiently with a specific analyte.

One exemplary embodiment can provide for the average minimum interaction length dependent on the analyte to be 1.0 mm to 100 mm, or 1 mm to 50 mm, or 1 mm to 10 mm. An average minimum interaction length of 2 mm to 5 mm would be for example a suitable minimum interaction length for detecting $CO_2$ as analyte.

The following example illustrates this. Assuming a wafer thickness of, for example, 260 μm per wafer 11A, 11B, and thus given an effective resonator length of 500 μm (calculated from: twice the wafer thickness 11A, 11B minus the thickness of the underside and top-side membranes 11C, 11D minus a possibly present flexible membrane 31 {see FIGS. 3, 4, 6} etc.) and an average of 2.5 circulations, this would result in an effective interaction length, or an average minimum interaction length, of 2.5 mm, which would be sufficient for example for CO2 quantification (depending on the desired accuracy, radiation power of the source and detector power). This would then yield a total of four reflections at the reflection elements 21, 22, for which a minimum reflectivity of R=78% would be required in order to obtain a sufficient interaction length in the resonator 19.

Such a configuration would be suitable even for strongly absorbent gases. For weak absorbers, higher reflectivities could be used in order to further increase the effective interaction length. A major advantage of the use of low reflectivities is that the sensor properties do not change significantly if a small change in the reflectivities occurs on account of an influence (temperature, water contamination, etc.).

This in turn is a major advantage over resonator concepts having a high Q-factor, in which mirrors having very high reflectivities are used (>99.99%). Here a small change in the reflectivity has drastic effects on the Q-factor and furthermore on the properties of the sensor.

The semiconductor substrate stack 11 depicted in FIG. 1 can be for example a wafer stack. The first semiconductor substrate 11A can accordingly be a first wafer, and the second semiconductor substrate 11B can accordingly be a second wafer. A section of the first and/or second semiconductor substrate 11A, 11B can be electrically contacted in order to form an electrode. As mentioned in the introduction, the first semiconductor substrate 11A can have a thinned-back section, or an additional layer, 11D in the region of the cavity 12. By way of example, said thinned-back section, or layer, 11D can be electrically contacted in order to form an electrode. The same applies to the thinned-back section 11C of the second semiconductor substrate 11B. At least one section of the first semiconductor substrate 11A can additionally be perforated. By way of example, the thinned-back section, or layer, 11D of the first semiconductor substrate 11A can be perforated. Consequently, a perforated top electrode 11D could be provided on the first semiconductor substrate or wafer 11A, wherein said electrode could be realized by standard microfabrication processes.

Figure 2:
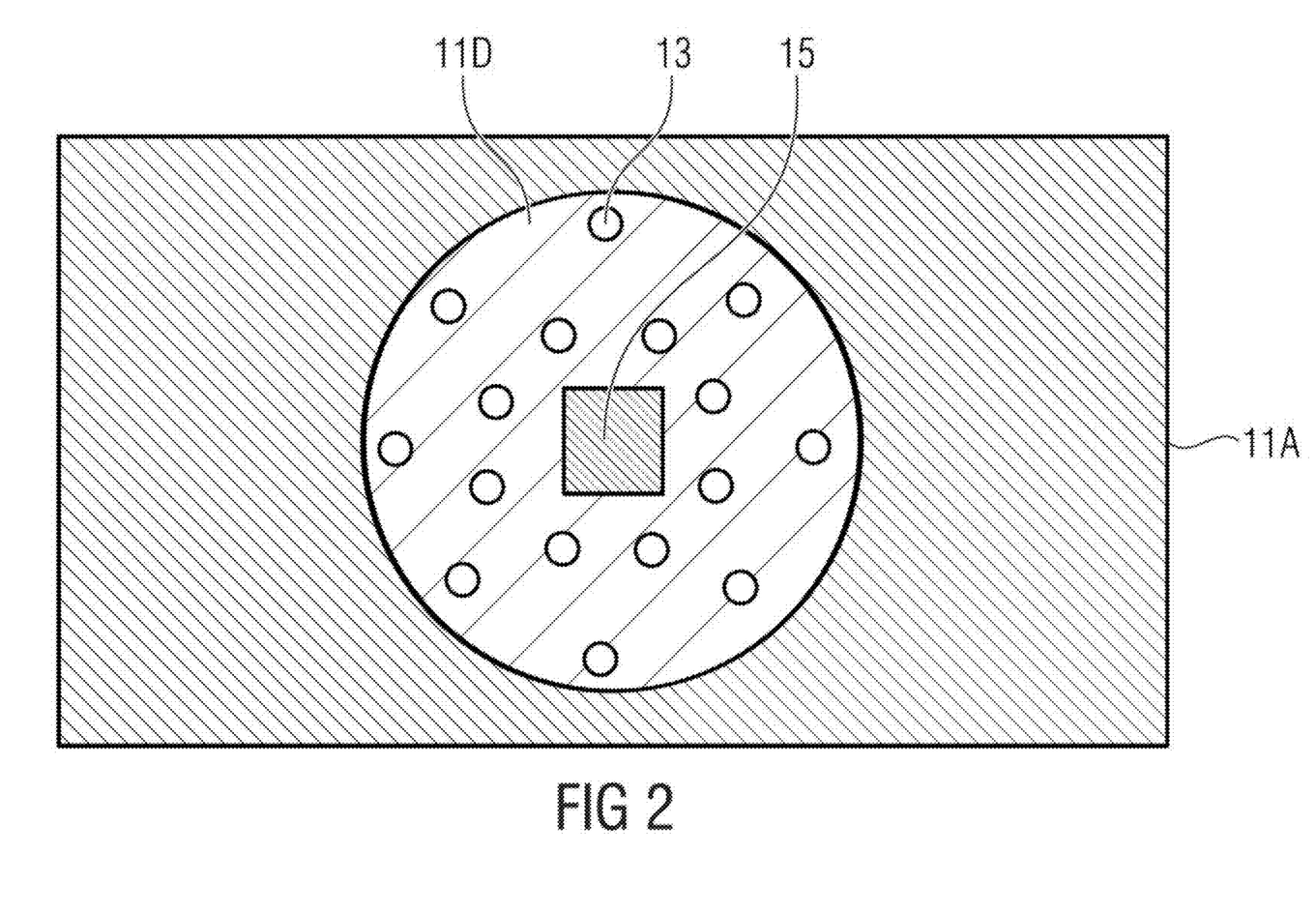
FIG. 2 shows a plan view of a first semiconductor substrate.

FIG. 2 shows for illustration purposes a plan view of the first semiconductor substrate 11A with the thinned-back section, or layer, 11D (top electrode), the radiation source 15 arranged thereon, and the access openings or perforations 13. The radiation source 15 can be arranged approximately in the center of the top electrode 11D.

The radiation source 15 can be for example an MIR source (MIR: mid-infrared), and be embodied e.g. as a multilayer emitter. Such a multilayer emitter can emit highly directional radiation and also narrowband radiation. In a manner similar to that in the previous section, a reflection element 21, e.g. a reflective mirror, can be arranged at the underside (not visible here in the plan view) of the MIR source 15 and would act as the upper part of the resonator 19.

Accordingly, the second wafer 11B together with an at least partly transmissive second reflection element 22, e.g. a semitransparent mirror, and also with a radiation detector, e.g. an infrared detector (e.g. thermopile or bolometer), could form the second part of the resonator 19. On account of the expected high intensity striking the detector 17, a thermal detector (e.g. thermopile or bolometer) can be considered which can readily be implemented using semiconductor technology. If a higher sensitivity is required, even more complex types of detector having a much higher sensitivity can also be considered.

Figure 3:
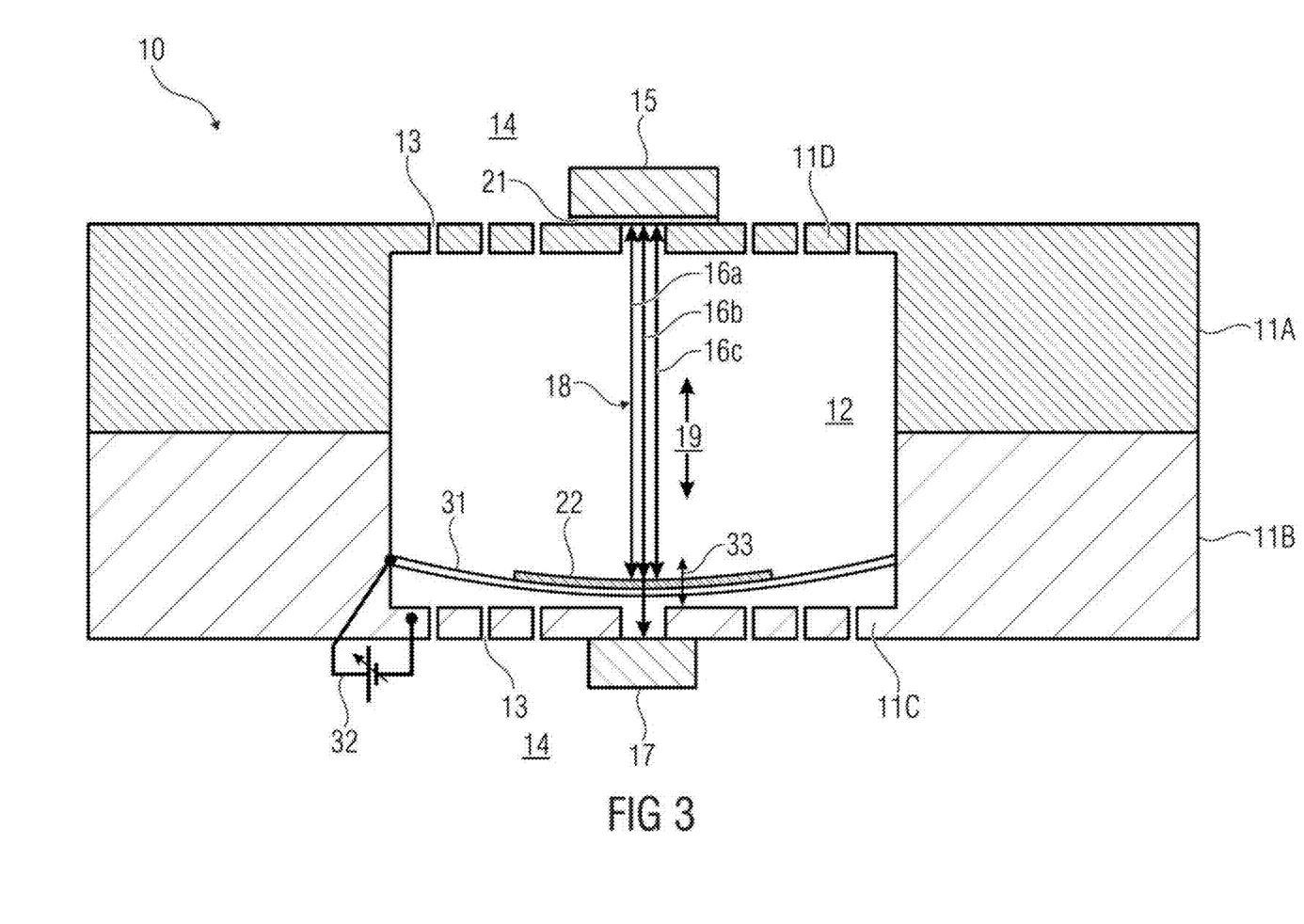
FIG. 3 shows a lateral sectional view of a MEMS component in accordance with a further exemplary embodiment.
Figure 4:
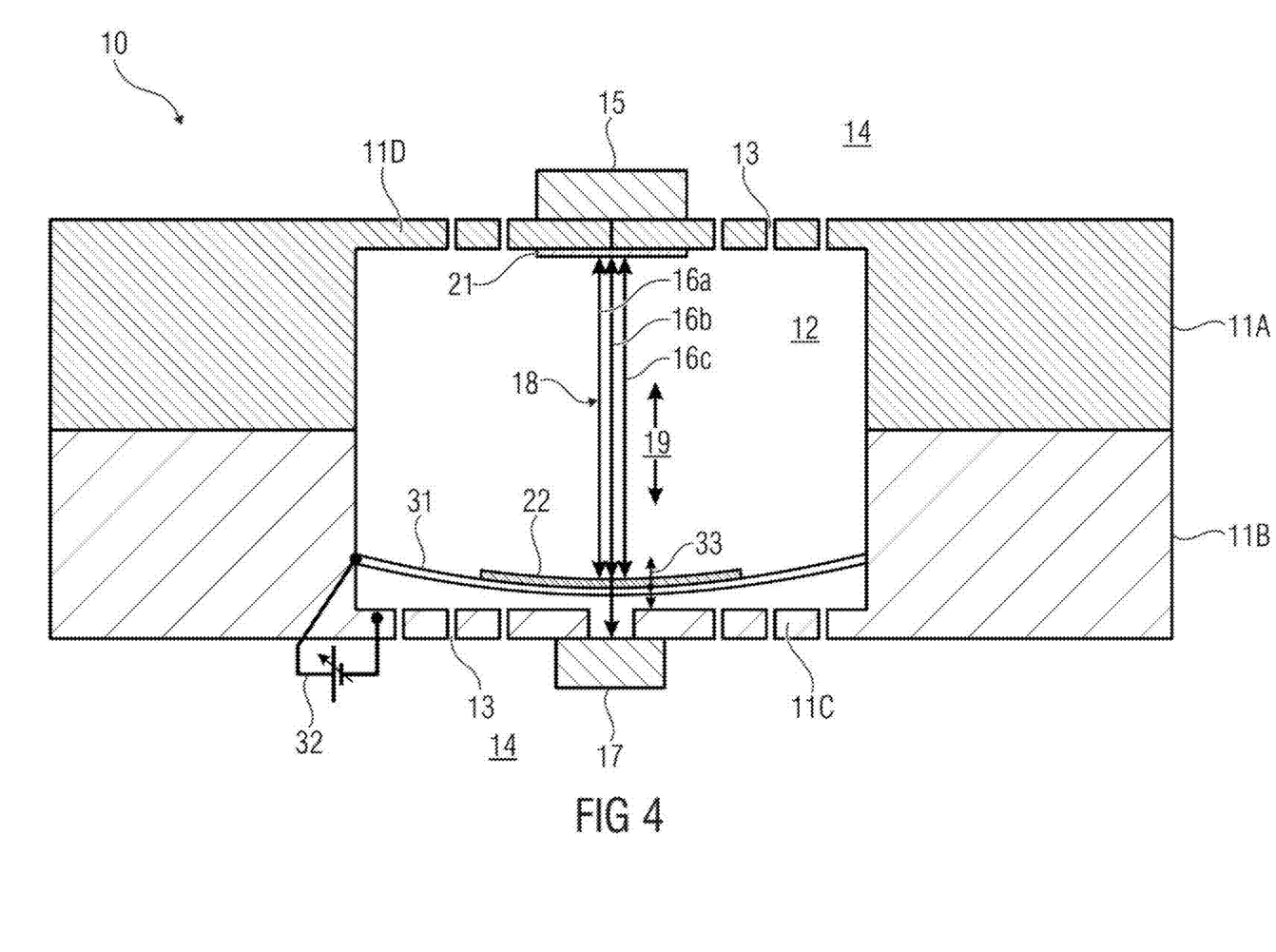
FIG. 4 shows a lateral sectional view of a MEMS component in accordance with a further exemplary embodiment.

FIGS. 3 and 4 show two further embodiments of a MEMS component 10. These two embodiments differ from one another in the arrangement of the first reflection element 21. In FIG. 3, the first reflection element 21 is arranged outside the cavity 12 between the radiation source 15 and the first semiconductor substrate 11A. In FIG. 4, the first reflection element 21 is arranged within the cavity 12 at the first semiconductor substrate 11A, and opposite the radiation source 15.

It could also be conceivable for both the first reflection element 21 and the second reflection element 22 to be arranged within the cavity 12.

The two embodiments depicted in FIGS. 3 and 4 differ from the embodiment discussed above with reference to FIG. 1 inter alia in that the thinned-back section, or layer, 11C of the second semiconductor substrate 11B can likewise have perforations or access openings 13 for gas exchange between the cavity 12 and an environment 14.

Furthermore, a membrane 31 can be arranged within the cavity 12. The membrane 31 can be a flexible membrane. The membrane 31 can be arranged within the cavity 12 at the semiconductor substrate stack 11, wherein the membrane 31 extends between the radiation source 15 and the radiation detector 17 substantially transversely with respect to the beam path 18 of the emitted radiation 16a, 16b, and 16c.

In the exemplary embodiment depicted in FIGS. 3 and 4, the membrane 31 can be arranged at the second semiconductor substrate 11B. However, it would likewise be conceivable for the membrane 31 to be arranged at the first semiconductor substrate 11A.

The membrane 31 can comprise a semiconductor material. By way of example, the membrane 31 can be produced from doped silicon.

Since doped silicon can be at least partly transmissive to the emitted radiation 16a, 16b, 16c, it can be advantageous to arrange the second reflection element 22 directly at the membrane 31. To put it more precisely, the second reflection element 22 can be arranged at a side of the membrane 31 facing the radiation source 15.

In this exemplary embodiment and all the other exemplary embodiments, the second reflection element 22 can comprise a metal layer, a structured metal layer, a photonic crystal structure layer or a layer stack comprising a plurality of Bragg grating layers.

The membrane 31 and the thinned-back section, or layer, 11C of the second semiconductor substrate 11B can be connected to a voltage supply 32. Consequently, the membrane 31 would form a first electrode section, and the thinned-back section, or layer, 11C of the second semiconductor substrate 11B would form a second electrode section.

By varying the applied voltage, it is possible for the membrane 31 to be deflected, as is indicated by the double-headed arrow 33. The membrane 31 can be deflected for example in the direction of the second electrode section 11C of the second semiconductor substrate 11B and/or in the direction of the first electrode section 11D of the first semiconductor substrate 11A. In other words, the membrane 31 can be moved up and/or down, in particular in the direction of the radiation source 15 and/or in the direction of the radiation detector 17.

In other words, therefore, the second semiconductor substrate 11B can have an electrode structure 11C arranged between the membrane 31 and the radiation detector 17, wherein the electrode structure 11C is electrically connectable to the membrane 31, and wherein in the event of an electrical voltage 32 being applied, the membrane 31 is deflectable relative to the electrode structure 11C.

The embodiments of the MEMS component 10 that are depicted in FIGS. 3 and 4 can be realized with two bonded wafers 11A, 11B. The first wafer 11A can have a section 11D that can be embodied as a top electrode and be realized by standard microfabrication processes.

In a manner similar to the exemplary embodiment depicted in FIG. 2, an MIR source 15, e.g. a multilayer emitter (see plan view in FIG. 2), can be arranged in the center of this top electrode 11D. The multilayer emitter 15 can be a thermal emitter with a multilayer spectral filter. The multilayer emitter 15 can emit directional and narrowband radiation, which is advantageous for the proposed concept. As an alternative thereto, it is possible to use a thermal emitter 15 in combination with a narrowband filter structure.

In these and all the other exemplary embodiments, the first reflection element 21, for example a highly reflective mirror (e.g. a thin metal layer such as Au, for instance), can be arranged on the underside of the MIR source 15, i.e. between the radiation source 15 and the first semiconductor substrate 11A (FIG. 3), or on the top electrode 11D within the cavity 12 (FIG. 4). In this case, the first reflection element 21 forms the upper end of the resonator 19.

The second wafer 11B can have a flexible membrane 31 and an, optionally perforated, bottom electrode 11C. The radiation detector 17 can be an IR detector.

The second reflection element 22, for example a mirror layer, can be arranged on the flexible membrane 31. The second reflection element 22 accordingly forms an underside mirror of the resonator 19. The radiation 16a, 16b, 16c, for example infrared radiation, emitted by the radiation source 15 can be reflected a number of times in the resonator 19, as a result of which the interaction length for the radiation 16a, 16b, 16c to interact with the analyte can be increased and the sensitivity of the MEMS component 10 can thus be increased.

The flexible membrane 31 and the bottom electrode 11C can be electrically conductive. By applying a voltage 32, it is possible for the flexible membrane 31 to be deflected, as a result of which the resonator length can be varied.

By the deflectable membrane 31, the effective length of the resonator 19 and thus the interaction length can thus be varied and adapted to analytes to be analyzed.

In accordance with one exemplary embodiment, for this purpose the membrane 31 can be deflectable in at least one direction along the beam path 18 between the radiation source 15 and the radiation detector 17, wherein the absolute value of the deflection of the membrane 31 can correspond to at least half the wavelength of the emitted radiation 16a, 16b, 16c.

Furthermore, the membrane 31 can be deflectable with a frequency of 10 to 500 oscillations per minute. Alternatively, the membrane 31 can be deflectable with a frequency of 0.1 Hz to 1000 Hz, i.e. with a frequency of 0.1 to 1000 oscillations per second. Alternatively, the membrane 31 can be deflectable with a frequency of approximately 10 to 100 oscillations per second, or at approximately 50 oscillations per second. In this case, the oscillating of the membrane 31 can help to move the analyte within the cavity 12 or within the resonator 19, or alternatively to purge or to evacuate the analyte from the cavity 12 or from the resonator 19. Oscillations in the ranges indicated lead to a particularly good (continuous) gas flow that enables a gas exchange between the cavity 12 and the environment. A particularly good pump function of the membrane 31 can thus be provided in these ranges.

For further improvement of the gas flow, or the pump function, the membrane 31 can have at least one flap. This is illustrated by way of example in a schematically illustrated enlarged view of an excerpt from such a membrane 31 in FIGS. 7A, 7B, 7C and 7D.

Figure 7A:
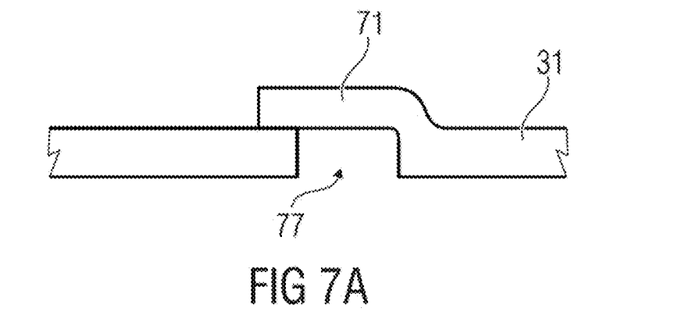
FIG. 7A shows a schematic side view of a membrane with a flap in an unactuated state.

The membrane 31 can have at least one flap 71, which for example can be embodied integrally with the membrane 31 or be arranged as a separate part at the membrane 31. As is shown in FIG. 7A, the flap 71 can overlap a part of the membrane 31 in the thickness direction of the membrane 31. The flap 71 can overlap for example a throughflow opening 77 provided in the membrane 31.

Figure 7B:
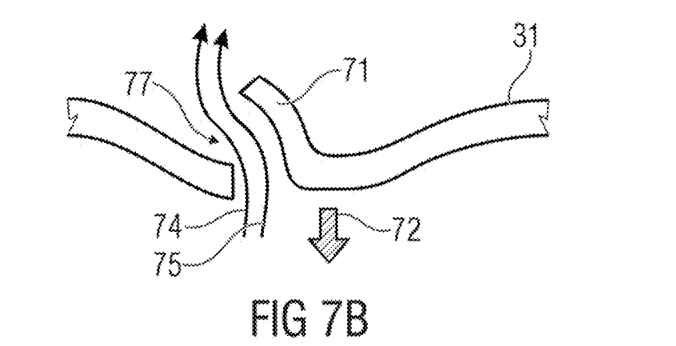
FIG. 7B shows a schematic side view of the membrane with flap in an actuation state functioning in the passage direction.

FIG. 7B shows that in the event of a downward movement of the membrane 31, represented by the arrow 72, the flap 71 lifts off from the membrane 31 in the opposite direction and releases a throughflow opening 77 in the membrane 31, such that a medium can flow through said throughflow opening 77, as is illustrated by the arrows 74 and 75. The medium can thus flow through the membrane 31, i.e. from one side of the membrane 31 to the other side of the membrane 31. In this case, the flap 71 functions like a valve switched in the passage direction.

Figure 7C:
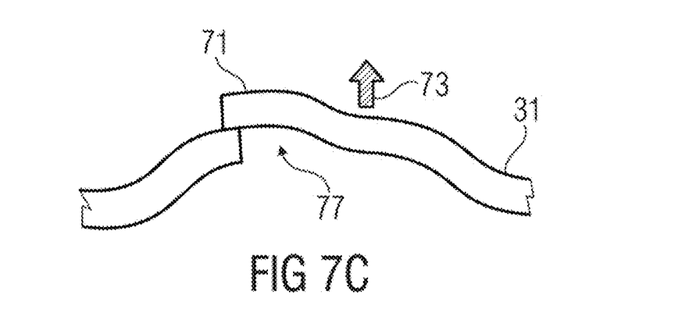
FIG. 7C shows a schematic side view of the membrane with flap in an actuation state functioning in the blocking direction.

FIG. 7C shows that in the event of an upward movement of the membrane 31, represented by the arrow 73, the flap 71 places itself against the membrane 31 in the opposite direction and thus closes the throughflow opening 77 mentioned above. Consequently, the medium can no longer flow through the membrane 31. In this case, the flap 71 functions like a blocked valve.

By repeatedly moving the membrane 31 up and down, in combination with the valve function provided by the flap 71, it is possible to obtain a unidirectional pump effect for the medium. In this case, the membrane 31 can have a plurality of flaps 71 of the abovementioned type.

In the exemplary embodiments such as are shown in FIGS. 3 and 4, an abovementioned downward movement, represented by the arrow 72, can correspond for example to a movement of the membrane 31 in the direction of the radiation detector 17, and an upward movement, represented by the arrow 73, can correspond for example to a movement of the membrane 31 in the direction of the radiation source 15. The at least one flap 71 can also be arranged on the opposite side of the membrane 31. The pump effect described above would then be reversed.

Figure 7D:
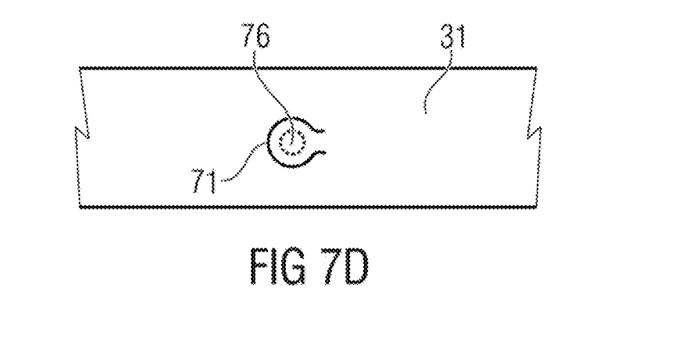
FIG. 7D shows a schematic side view of the membrane with flap in a plan view.

FIG. 7D shows for illustration purposes a plan view of such a membrane 31 having a flap 71. The flap 71 can be arranged at the membrane 31 and cover an underlying opening 76 in the membrane 31.

As has already been mentioned in the introduction, in the exemplary embodiments such as are depicted in FIGS. 3 and 4, the interspace 19 between the two reflection elements 21, 22 can form a resonator or a multi pass cavity, wherein the resonator 19 in these exemplary embodiments would be formed between the flexible membrane 31 and the top electrode 11D.

The top electrode 11D and the bottom electrode 11C can each be perforated in order to enable an analyte to penetrate into the cavity 12.

In this exemplary embodiment, the flexible membrane 31, as a part of the resonator 19, can serve to increase the effective interaction length.

Since the resonator 19 can be much larger than the wavelength of the emitted radiation 16a, 16b, 16c, the effect on the spectral distribution is a very narrowly spaced frequency comb, which is in turn not used to tune the wavelength selectively to the individual absorption band of the analyte. Therefore, the resonator 19 here is not used as a Fabry-Pérot resonator.

If necessary, the narrow spacing can be further smoothed by the movement of the flexible membrane 31. If the membrane 31 is moved (by half the wavelength of the emitted radiation 16a, 16b, 16c, which would correspond to approximately 2.1 µm, e.g. for the CO2 main absorption line), the lines move and an effectively continuous spectrum can be obtained.

Figure 5:
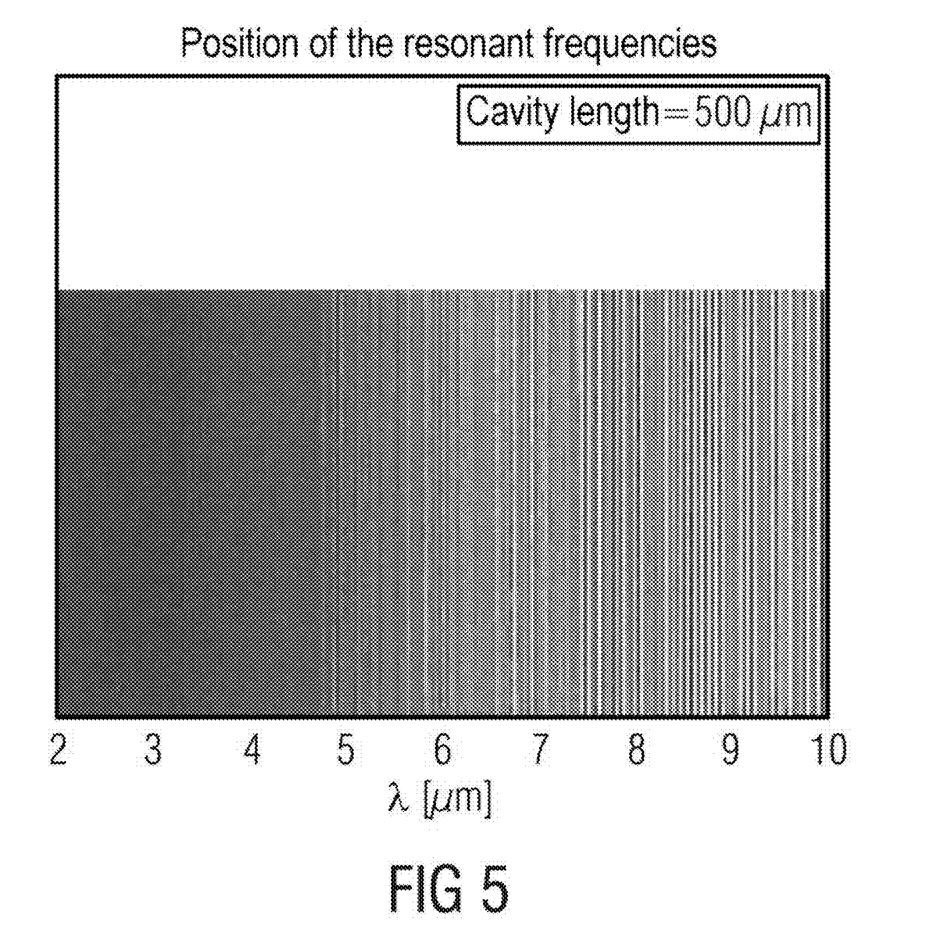
FIG. 5 shows a spectrogram of resonant frequencies in a Fabry-Pérot cavity having an exemplary length of 500 µm.

As an example, FIG. 5 illustrates the position of the resonant frequencies of a Fabry-Pérot resonator for a resonator length of 500 µm.

Here, too, it again holds true that the length of the resonator 19 and the reflectivity of the reflection elements 21, 22 should be adapted to the absorption of the gas in order to obtain the optimum interaction length.

Furthermore, a moving membrane 31 can be advantageous for accelerating the gas exchange in the sample chamber (cavity) 12. In this context, it would be conceivable, for example, to produce one or more of the flaps 71 described above on the membrane 31, which act substantially as valves, whereby the gas can flow only in one direction.

In all the exemplary embodiments of the MEMS component 10 as described above, the positioning of the radiation detector 17 and of the radiation source 15 could be interchanged.

Alternatively or additionally, moreover, in the semiconductor substrate stack 11, a third semiconductor substrate, for example a glass wafer, could be inserted as a spacer element between the first and second semiconductor substrates 11A, 11B, as a result of which an adaptation of the resonator length could be realized in a wide range.

Figure 6:
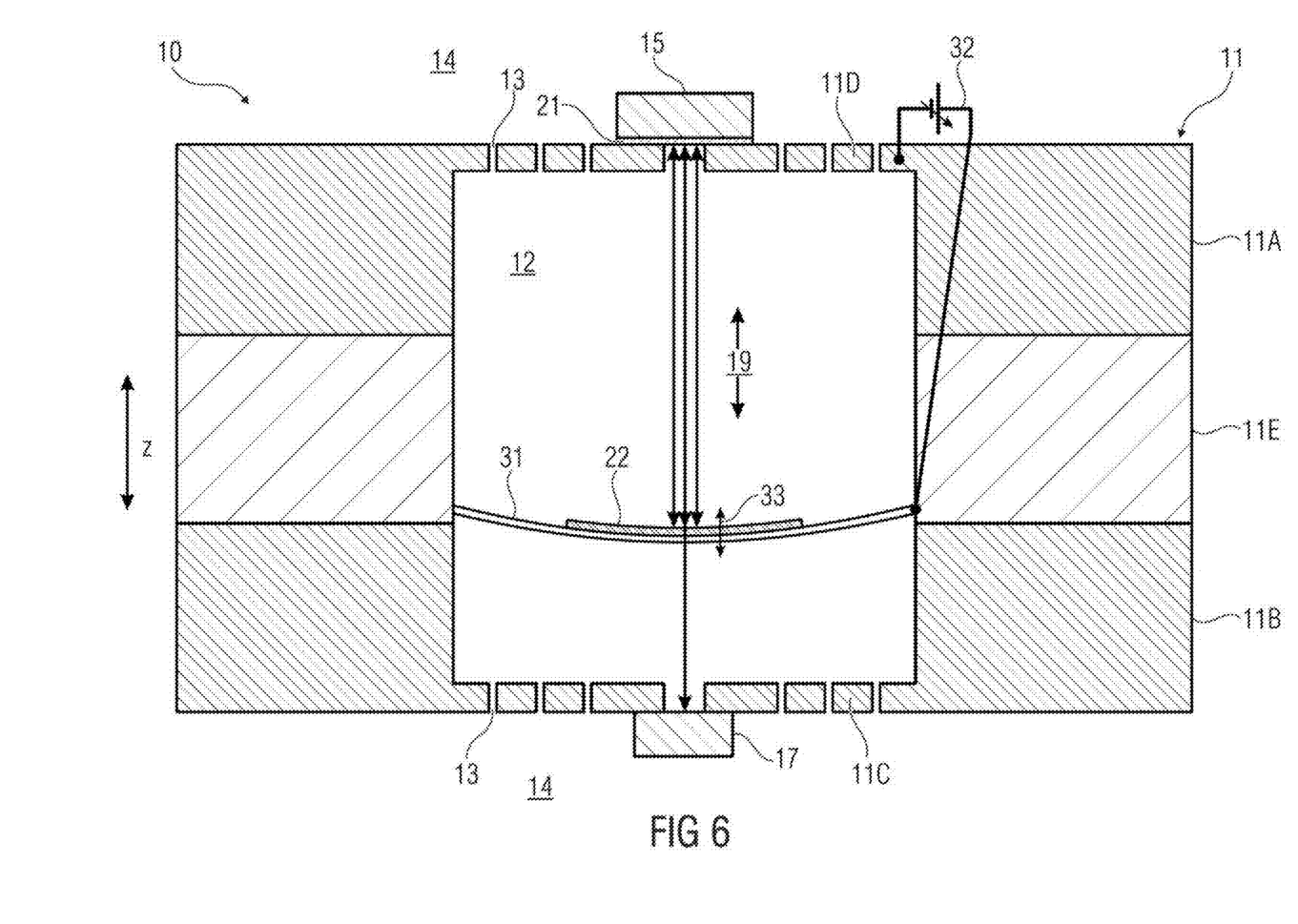
FIG. 6 shows a lateral sectional view of a MEMS component in accordance with a further exemplary embodiment.

One such embodiment is illustrated in FIG. 6. Here the semiconductor substrate stack 11 has a third semiconductor substrate 11E, which is arranged between the first semiconductor substrate 11A and the second semiconductor substrate 11B.

As can be discerned, the length of the resonator 19 and thus the interaction length with the analyte can thereby be increased by the thickness of the third semiconductor substrate 11E. The above-described advantage of the variable interaction length by the deflection of the flexible membrane 31 is additionally afforded.

For this purpose, the membrane 31 can be electrically connectable to the first semiconductor substrate 11A, and in particular to the thinned-back section, or layer, 11D of the first semiconductor substrate 11A, by a voltage source 32. As a result, the membrane 31 forms a first electrode structure and the thinned-back section, or layer, 11D of the first semiconductor substrate 11A forms a second electrode structure.

In accordance with this embodiment, therefore, the first semiconductor substrate 11A would have an electrode structure 11D arranged between the membrane and the radiation source, wherein this first electrode structure 11D would be electrically connectable to the membrane 31, and wherein in the event of an electrical voltage 32 being applied, the membrane 31 would be deflectable relative to the first electrode structure 11D.

Alternatively or additionally, however, it would also be conceivable for the second semiconductor substrate 11B, and in particular the thinned-back section, or layer, 11C of the second semiconductor substrate 11B, as described above with reference to FIGS. 3 and 4, to be electrically connected to the membrane 31 by a voltage source 32. In this case, a deflection of the membrane 31 relative to the second semiconductor substrate 11B, and in particular relative to the thinned-back section 11C of the second semiconductor substrate 11B, said section forming an electrode, could be realized.

Referring to FIG. 6 again, in this exemplary embodiment, therefore, three wafers 11A, 11B, 11E bonded to one another are combined to form a semiconductor substrate stack 11.

A perforated top electrode 11D can be realized on the first wafer 11A by standard microfabrication processes. A radiation source 15, for example an MIR source, can be arranged approximately in the center of the top electrode 11D. The radiation source 15 can be e.g. a multilayer emitter such as has already been explained in the previous sections (FIG. 2). The multilayer emitter 15 can emit highly directional and narrowband radiation.

Likewise in a manner similar to that in the previous sections, a reflective mirror 21 (e.g. a thin metal layer), which acts as an upper part of the resonator 19, can be applied at the underside of the MIR source 15. In other words, the first reflection element 21 can be arranged between the radiation source 15 and the first semiconductor substrate 11A, as shown in FIG. 6, or the first reflection element 21 can be arranged on the first semiconductor substrate 11A within the cavity 12, as is illustrated in FIG. 4, for example.

The membrane 31 can be arranged within the cavity 12 at the third semiconductor substrate 11E. However, it would likewise be conceivable for the membrane 31 to be arranged within the cavity 12 at the first or the second semiconductor substrate 11A, 11B. At any rate a greater possibility for varying the effective length of the resonator 19 is available as a result of the provision of the third semiconductor substrate 11E.

The second reflection element 22 can be arranged on the membrane 31, and in particular on a side of the membrane 31 facing the radiation source 15, that is to say that the flexible membrane 31 can for example be produced with a mirror layer and thus form an underside mirror of the resonator 19, which leads to a modular concept. However, it would also be conceivable for the second reflection element 22 to be arranged at an underside, i.e. at a side facing the radiation detector 17, of the membrane 31. It would likewise be conceivable for the membrane 31 to have an at least partly transmissive reflection element in each case on both sides.

The emitted radiation 16a, 16b, 16c, for example infrared radiation, can be reflected a number of times in the resonator 19, as a result of which the interaction distance for the emitted radiation 16a, 16b, 16c to interact with the analyte is increased and the sensitivity of the MEMS component 10 is thus increased.

The top electrode 11D and the flexible membrane 31 can be electrically conductive. By applying a voltage, it is possible for the flexible membrane 31 to be moved, as a result of which a dynamic variation of the resonator length can be made possible.

In other words, as a result of skillful arrangement of the membrane 31 within the cavity 12, the selected semiconductor substrate 11A, 11B, and 11E can thus enable a static variation of the resonator length, while the deflection of the membrane 31 by the electrical voltage can provide a dynamic variation of the resonator length during operation.

In the exemplary embodiment depicted in FIG. 6, the second wafer 11B can additionally have the radiation detector 17, for example an infrared detector. On account of the expected high intensity of the emitted radiation 16a, 16b, 16c striking the detector 17, a thermal detector (e.g. thermopile or bolometer) can be considered, which can readily be implemented using semiconductor technology.

If a higher sensitivity is required, even more complex types of detector having a much higher sensitivity can also be considered. Implementing the MEMS component 10 with three wafers 11A, 11B, 11E has the advantage that there is more freedom when designing the length of the resonator 19. Moreover, a certain degree of modularity is made possible as a result since the detector 17, the source 15 and also the lower resonator end mirror 22 are incorporated independently of one another. This also simplifies the production of the membrane 31.

As can be discerned particularly well in the exemplary embodiment comprising three semiconductor substrates 11A, 11B, 11E as depicted in FIG. 6, a main portion of the emitted radiation 16a, 16b, 16c propagates along an arrangement direction of the individual semiconductor substrates 11A, 11B, 11E in the semiconductor substrate stack 11 through the cavity 12, or through the interspace (resonator) 19 between the two reflection elements 21, 22.

In other words, the individual semiconductor substrates 11A, 11B, 11E within the semiconductor substrate stack 11 are arranged one above another in a vertical direction, or in the z-direction illustrated. The main portion of the emitted radiation 16a, 16b, 16c just mentioned also propagates in this direction. In this case, the main portion of the emitted radiation 16a, 16b, 16c can moreover propagate approximately rectilinearly between the radiation source 15 and the radiation detector 17. This can be realizable for example by beam shaping elements, for example by beam shaping optical elements, such as lenses, prisms and the like.

The two preceding paragraphs concerning the propagation of the emitted radiation 16a, 16b, 16c equally also apply to all other exemplary embodiments comprising more or fewer than three semiconductor substrates within the semiconductor substrate stack 11.

A further modification of all the exemplary embodiments could provide a coating (not explicitly illustrated here) of at least one section of the semiconductor substrate stack 11 and/or of the membrane 31 within the cavity 12, said coating being reflective to the emitted radiation 16a, 16b, 16c. Stray radiation could thus be guided within the cavity 12 in the direction of the detector 17.

It would be conceivable for such a reflective coating to be provided for example on the entire resonator top-side membrane and/or on at least one resonator wall in order to increase the total light efficiency.

The MEMS component 10 and its advantages are summarized once again below using different words.

One aspect of the MEMS component 10 consists in producing an optical gas sensor comprising for example a narrowband MIR emitter (MIR: mid-infrared range) 15, an interaction path realized as a resonator 19 in the silicon (semiconductor substrate), and an IR detector (IR: infrared) 17. Flexible, electrically conductive, membranes 31 can optionally be used for the fine tuning of specific properties and for pumping, in order to purge the measuring cell 10. The MEMS component 10 can for example combine concepts from microphone technology with concepts from wafer bonding techniques for tire pressure sensors.

In this regard, established MEMS microphone technology could be used, for example. Using these technologies, MEMS acoustic transducers could be produced, for example, comprising a substrate with a resonator 19 and a conductive backplate unit having a plurality of conductive perforated backplate sections extending over the substrate resonator. One concept of the present disclosure would accordingly relate to the use of a MEMS acoustic transducer as an optical gas sensor.

Such a technology is currently used for the production of a MEMS microphone with a possible future extension to MEMS loudspeakers. To date, however, it has never yet been used in the context of optical sensors. For the present MEMS component 10, such an established technology, possibly in combination with wafer bonding, could be used to produce novel structures that could be suitable for IR sensors in accordance with the present disclosure.

Therefore, one aspect could thus envisage providing a fully integrated micro gas sensor based on IR absorption using established microphone technology together with the modifications described herein.

As has already been mentioned at the beginning of this disclosure, various types of gas sensors for detecting gases are known. Multi pass cells and also resonator-amplified IR spectroscopy, Fabry-Pérot resonators, MOX sensors, or else evanescent wave absorption sensors are known, inter alia.

One advantage of the present MEMS component 10 over resonator-amplified IR spectroscopy is that it is possible to produce an integrated monolithic CMOS component having a mirror reflectivity of below 90% in which the increase in the interaction length with the gas is precisely sufficient to enable quantitative measurements.

In multi pass cells there is the need for exactly curved and inclined elements. In view of the miniaturization the MEMS component 10 described herein follows, by contrast, an approach of increasing a distance using a resonator construction as described in the exemplary embodiments of this disclosure.

The typical feature of a Fabry-Pérot resonator is the wavelength selectivity thereof. However, this applies to the MEMS component 10 described herein not necessarily under the same limitations as in the case of a Fabry-Pérot resonator. Consequently, even miniaturized MEMS-based Fabry-Pérots are not comparable with the MEMS component 10 described herein.

Fabry-Pérot resonators including MEMS-based Fabry-Pérot interferometers have already been used for IR absorption sensors. However, the task of the Fabry-Pérot resonator in such cases is to tune the frequency of the sensor. In this context, Fabry-Pérots operate with a low order and have a resonator length of up to ten times the wavelength. The concept described herein, by contrast, provides for using much longer resonators 19 having a length of at least ten times, or at least twenty times, or approximately fifty times, the wavelength or longer.

The MOX sensors mentioned in the introduction are also based on a totally different detection principle. In the case of MOX sensors, the conductivity thereof changes if sensors of this type adsorb gases on their surface. By contrast, the MEMS component 10 described herein is based on the principle of optical spectroscopy. The main advantage of optical spectroscopy over MOX sensors is that optical spectroscopy is a firmly established technology having a high selectivity and moreover is known for being highly sensitive.

In the case of evanescent wave absorption sensors, the main disadvantages are the internal losses thereof on account of the waveguide material and the small evanescent field ratio, as a result of which this approach is better suited to the detection of liquids.

In contrast to evanescent wave absorption sensors, the MEMS component 10 described herein uses an approach with a free beam appertaining to geometric optics. This has the effect that the proposed concept uses the entire field for interaction with the medium, and not just the evanescent outliers. This increases the sensitivity and it becomes easier to achieve the interaction distance required. Moreover, the internal loss that occurs on account of the field conduction in the dielectric waveguide is avoided.

According to the current level of knowledge, no integrated system having the features described herein exists which contains an emitter (radiation source 15) and a detector 17 in a single chip (semiconductor substrate stack 11) and in which the resonator 19 is used to extend the interaction length of the sensor 10.

On account of the intelligent design of the MEMS component 10 described herein, the extent in the z-direction of the semiconductor substrate 11 can be utilized, thereby making it possible to minimize the lateral dimensions of the sensor 10. This is very advantageous in the mass production of semiconductors. Moreover, available emitter concepts that emit in the direction out of the plane can be used.

A movement of the membrane 31 can be of assistance during gas exchange in the sample chamber 12, which is a further important advantage for a fast response time.

The quality of the reflection elements 21, 22, such as e.g. mirrors, is important and can be a limiting factor. The accuracy of the sensor 10 depends on the interaction length, which is one of the most important limiting factors for gases which do not have strong absorption bands.

A plurality of circulations in a rather large (vertical) resonator 19, such as are shown in the exemplary embodiments described herein, offer a sufficient interaction length for gases that are to be measured by IR absorption.

A further aspect of the MEMS component 10 described herein consists in producing an optical gas sensor comprising for example a thermal emitter 15 or a narrowband MIR emitter (MIR: mid-infrared range), an interaction path realized as a gas-guided resonator 19, and an IR detector 17. In accordance with the concept described herein, by way of example, a microphone technology can be adapted to the effect of creating a resonator 19 in the direction out of the plane of the semiconductor substrate 11.

On account of the long resonator 19 in comparison with the wavelength of interest, the resonator 19 does not operate as a spectral filter, as is the case for example for a Fabry-Pérot resonator. Rather, the resonator 19 having a sufficiently high Q-factor is used to extend the effective interaction length of the absorbent medium, and thus to achieve the required sensitivity.

A flexible conductive membrane 31, possibly having flaps 71 (such as are usable for the ventilation of silicon microphones), can be used for pumping in order to support the gas exchange in the measuring cell 12. A flexible, electrically conductive, membrane 31 can for example comprise silicon, or be a membrane produced from silicon. Since doped silicon has a low reflectivity in the mid-infrared range, it may be advantageous to apply a mirror layer as a reflection element 21, 22 on the membrane 31.

Possible realizations of the reflection elements 21, 22 (e.g. mirrors) may be a very thin metal layer, a structured metal layer or a Bragg layer stack. Furthermore, it would additionally be possible to include one or more sensor paths (radiation source 15 and detector 17) on a single membrane 31 and/or in a single resonator 19 in order to obtain a multi gas sensor, or to include reference paths.

The exemplary embodiments described above merely represent an illustration of the principles of the present invention. It goes without saying that modifications and variations of the arrangements and details described herein will become apparent to others skilled in the art. Therefore, the intention is for the invention to be restricted only by the scope of protection of the following patent claims, and not by the specific details that have been presented on the basis of the description and the explanation of the exemplary embodiments herein.

What is claimed is:

1. A MEMS component, comprising:
a semiconductor substrate stack having a first semiconductor substrate and a second semiconductor substrate connected thereto, wherein the semiconductor substrate stack comprises a cavity formed within the first and second semiconductor substrates,
wherein at least the first or the second semiconductor substrate comprises an access opening for gas exchange between the cavity and an environment,
wherein a radiation source is coupled to the first semiconductor substrate, said radiation source being configured to emit radiation into the cavity, and wherein a radiation detector is physically connected to the second semiconductor substrate, said radiation detector being configured to receive at least one part of the radiation emitted by the radiation source through the cavity,
wherein two mutually spaced apart reflection elements for reflecting the emitted radiation are arranged in a beam path between the radiation source and the radiation detector, wherein at least one reflection element is partly transmissive to the emitted radiation from the cavity in the direction of the radiation detector, and wherein an interspace between the two mutually spaced apart reflection elements comprises a length that is at least ten times a wavelength of the emitted radiation, and
wherein the radiation source comprises a multilayer emitter physically connected to at least one reflection element.

2. The MEMS component as claimed in claim 1, wherein a distance covered by the emitted radiation in the interspace defines an interaction length within which the emitted radiation can interact with an analyte situated in the interspace, and wherein the length of the interspace or of the cavity corresponds to at least an average minimum interaction length dependent on the analyte.

3. The MEMS component as claimed in claim 1, wherein a distance covered by the emitted radiation in the interspace defines an interaction length within which the emitted radiation can interact with an analyte situated in the interspace, and wherein the two mutually spaced apart reflection elements are configured to reflect the emitted radiation in each case at least once in order to increase the interaction length of the emitted radiation in the interspace between the two reflection elements, wherein the interaction length increased by the reflection corresponds to at least an average minimum interaction length dependent on the analyte.

4. The MEMS component as claimed in claim 2, wherein the average minimum interaction length dependent on the analyte is 1.0 mm to 100 mm.

5. The MEMS component as claimed in claim 1, wherein a first reflection element of the two mutually spaced apart reflection elements is arranged outside the cavity between the radiation source and the first semiconductor substrate, or wherein the first reflection element is arranged within the cavity at the first semiconductor substrate and opposite the radiation source.

6. The MEMS component as claimed in claim 1, wherein a second reflection element of the two mutually spaced apart reflection elements is arranged within the cavity at the second semiconductor substrate and opposite the radiation detector.

7. The MEMS component as claimed in claim 1, wherein within the cavity a flexible membrane is arranged at the semiconductor substrate stack, wherein the membrane extends between the radiation source and the radiation detector transversely with respect to the beam path of the emitted radiation.

8. The MEMS component as claimed in claim 7, wherein the membrane comprises a semiconductor material.

9. The MEMS component as claimed in claim 7, wherein a second reflection element of the two mutually spaced apart reflection elements is arranged at a side of the membrane facing the radiation source.

10. The MEMS component as claimed in claim 9, wherein the second reflection element comprises a metal layer arranged at the membrane, a structured metal layer, a photonic crystal structure layer or a layer stack comprising a plurality of Bragg grating layers.

11. The MEMS component as claimed in claim 7, wherein the second semiconductor substrate comprises an electrode structure arranged between the membrane and the radiation detector, said electrode structure being electrically connectable to the membrane, wherein in an event of an electrical voltage being applied, the membrane is deflectable relative to the electrode structure.

12. The MEMS component as claimed in claim 7, wherein the first semiconductor substrate comprises an electrode structure arranged between the membrane and the radiation source, said electrode structure being electrically connectable to the membrane, wherein in an event of an electrical voltage being applied, the membrane is deflectable relative to the electrode structure.

13. The MEMS component as claimed in claim 11, wherein the membrane is deflectable at least in a direction along the beam path between the radiation source and the radiation detector, and wherein the absolute value of the deflection of the membrane corresponds to at least half the wavelength of the emitted radiation.

14. The MEMS component as claimed in claim 11, wherein the membrane is deflectable with a frequency of 0.1 to 1000, or of 10 to 100, or of approximately 50, oscillations per second.

15. The MEMS component as claimed in claim 11, wherein the membrane comprises at least one flap configured to block or to release a through opening for a medium to flow through from a first side of the membrane to an opposite second side of the membrane depending on a direction of movement of the membrane.

16. The MEMS component as claimed in claim 1, wherein a main portion of the emitted radiation, along an arrangement direction of individual semiconductor substrates in the semiconductor substrate stack, propagates through the cavity or through the interspace between the two reflection elements.

17. The MEMS component as claimed in claim 1, wherein the semiconductor substrate stack comprises a third semiconductor substrate, which is arranged between the first and second semiconductor substrates.

18. The MEMS component as claimed in claim 1, wherein at least one section of the semiconductor substrate stack within the cavity comprises a coating that is reflective to the emitted radiation.

19. The MEMS component as claimed in claim 1, wherein the radiation source is configured to emit infrared radiation in a wavelength range of 0.8 µm to 40 µm, and wherein the radiation detector is configured to receive infrared radiation in a wavelength range of 0.8 µm to 40 µm.

20. The MEMS component as claimed in claim 1, wherein a first and/or second reflection element of the two mutually spaced apart reflection elements comprise(s) a reflectivity R of 50%<R<98%, or of 60%<R<90%, or of 70%<R<85%.

21. The MEMS component as claimed in claim 1, wherein the MEMS component is embodied as a MEMS micro gas detector configured to detect at least one gas situated in the interspace between the two reflection elements, on the basis of an absorption of the emitted radiation by the radiation detector.

22. A MEMS component, comprising:
a semiconductor substrate stack having a first semiconductor substrate and a second semiconductor substrate connected thereto, wherein the semiconductor substrate stack comprises a cavity formed within the first and second semiconductor substrates,
wherein at least the first or the second semiconductor substrate comprises an access opening for gas exchange between the cavity and an environment,
wherein a radiation source is arranged at the first semiconductor substrate, said radiation source being configured to emit radiation into the cavity, and wherein a radiation detector is arranged at the second semiconductor substrate, said radiation detector being configured to receive at least one part of the radiation emitted by the radiation source through the cavity,
wherein two mutually spaced apart reflection elements for reflecting the emitted radiation are arranged in a beam path between the radiation source and the radiation detector, wherein at least one reflection element is partly transmissive to the emitted radiation from the cavity in the direction of the radiation detector, and wherein an interspace between the two mutually spaced apart reflection elements comprises a length that is at least ten times a wavelength of the emitted radiation,
wherein within the cavity a flexible membrane is arranged at the semiconductor substrate stack, wherein the membrane extends between the radiation source and the radiation detector transversely with respect to the beam path of the emitted radiation, and
wherein the second semiconductor substrate comprises an electrode structure arranged between the membrane and the radiation detector, said electrode structure being electrically connectable to the membrane, wherein in an event of an electrical voltage being applied, the membrane is deflectable relative to the electrode structure.

23. A MEMS component, comprising:
a semiconductor substrate stack having a first semiconductor substrate and a second semiconductor substrate connected thereto, wherein the semiconductor substrate stack comprises a cavity formed within the first and second semiconductor substrates,
wherein at least the first or the second semiconductor substrate comprises an access opening for gas exchange between the cavity and an environment,
wherein a radiation source is arranged at the first semiconductor substrate, said radiation source being configured to emit radiation into the cavity, and wherein a radiation detector is arranged at the second semiconductor substrate, said radiation detector being configured to receive at least one part of the radiation emitted by the radiation source through the cavity,
wherein two mutually spaced apart reflection elements for reflecting the emitted radiation are arranged in a beam path between the radiation source and the radiation detector, wherein at least one reflection element is partly transmissive to the emitted radiation from the cavity in the direction of the radiation detector, and wherein an interspace between the two mutually spaced apart reflection elements comprises a length that is at least ten times a wavelength of the emitted radiation,
wherein within the cavity a flexible membrane is arranged at the semiconductor substrate stack, wherein the membrane extends between the radiation source and the radiation detector transversely with respect to the beam path of the emitted radiation, and
wherein the first semiconductor substrate comprises an electrode structure arranged between the membrane and the radiation source, said electrode structure being electrically connectable to the membrane, wherein in an event of an electrical voltage being applied, the membrane is deflectable relative to the electrode structure.

* * * * *